PHOTOMODULATOR FOR USE WITH HIGH GAIN D.C. AMPLIFIER

Filed May 7, 1963

United States Patent Office 3,283,157

Patented Nov. 1, 1966

3,283,157

PHOTOMODULATOR FOR USE WITH HIGH GAIN D.C. AMPLIFIER

David E. Blackmer, Waltham, Mass., assignor to Instrumentation Laboratory Inc., Boston, Mass., a corporation of Massachusetts Filed May 7, 1963, Ser. No. 278,670
23 Claims. (Cl. 250—209)

This invention relates to modulator arrangements for use in direct current amplifiers and to improved electric components particularly useful in such arrangements.

In high gain D.C. amplifiers, a modulator arrangement is conventionally employed for purposes of stabilization. The modulator interrupts or "chops" the input signal at a frequency convenient for amplification, and the chopped signal after amplification is demodulated to recover the original waveform. The most commonly used modulator device cyclically opens and closes contact elements for circuit interruption. While such devices are adequate for many applications, the mechanical drive inherently introduces a factor of unreliability. In addition, the surface state and work function of the contact materials vary with time affecting the quality of the signal output. Other modulators devised in efforts to overcome the problems of the electromechanical chopper arrangements include vibrating capacitor type devices; photomodulator arrangements which employ a light source and a light sensitive resistance; and transistorized arrangements. Such arrangements overcome the reliability problem to a large extent but either are very expensive or do not afford the desired accuracy where precise measurements involving extremely small currents or voltages are required.

Where the signal source has a high impedance, as in the case of a pH electrode for example ($10^9$ ohms), a current generated by the modulator of a magnitude in the order of $10^{-12}$ amperes will introduce a significant error. Similarly, in applications involving the measurement of very small voltages, such as the output voltage of a thermocouple, a modulator system offset voltage in the order of a few microvolts added in series with the input will introduce a significant error.

Accordingly, it is an object of this invention to provide a novel and improved modulator device for use in stabilizing high gain D.C. amplifiers.

Another object of this invention is to provide novel and improved electronic components having lower offset voltage and offset current characteristics.

Still another object of the invention is to provide a novel and improved high speed electronic control component employing a light source and radiation sensor element having electrical characteristics which vary as a function of the light for use in control applications.

Other objects, features and advantages of the invention will be seen as the following description of a preferred embodiment thereof progresses, in conjunction with the drawing, in which.

Figures 1, 2:
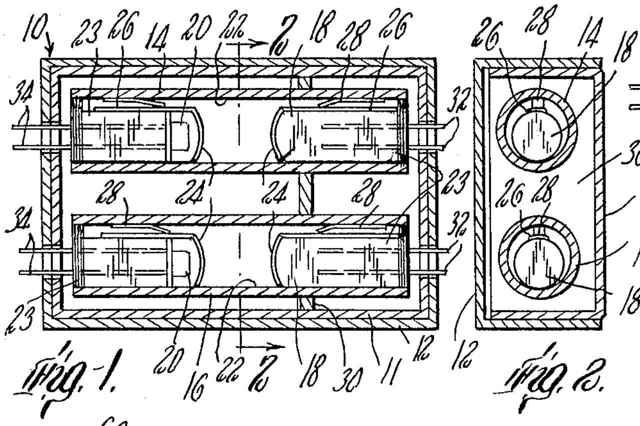
FIG. 1 is a sectional view of a photomodulator structure constructed in accordance with the invention.
FIG. 2 is a sectional view taken along the line 2—2 of FIG. 1 of the photomodulator structure.

The photomodulator unit shown in FIGS. 1 and 2 includes a metal case 10 having a base portion 11 and cooperating cover 12 which are secured together in conventional manner. Mounted within this case are two metal tubes 14, 16, each of which includes a neon bulb light source 18 and a cadmium selenide photocell unit 20. The interior surface 22 of each metal tube 14, 16 is smooth and provides a reflecting element for radiation produced by the neon bulb 18 so that that radiation is directed onto the sensitive surface of the photocell 20. The bulb and photocell are sealed within the tube so that external radiation is excluded.

Both the bulbs and the photocells include glass envelopes 23, and on the facing surface of each envelope is a light transmitting electrically conductive film 24, which in the preferred embodiment is a deposited film of Inconel (a high nickel-chromium iron alloy) about one hundred Angstroms in thickness with a thin layer of silicon monoxide deposited thereover. Each film 24 is electrically connected to a strip of conductive silver paint 26 which extends along the length of each envelope 23. This electrically conductive strip 26 contacts a resilient connector member 28 positioned between the envelope 23 and the interior surface 22 of the tube so that the two opposed films 24 are at the same electric potential as the tubes 14, 16. A copper plate 30 is soldered to and supports the two tubes 14, 16 in spaced, aligned relation. In this manner two films of uniform light transmitting characteristics, disposed between the light source and photocell components, are maintained at the same electric potential as the case 10 so that the capacitive coupling between these input and output components is less than $10^{-17}$ farads without distortion or excessive reduction of the illumination of the photocell sensing surface.

Input signal leads 32 for the light sources 18 and output leads 34 from the photocells 20 are brought out through apertures in the casing 10 for connection to external circuitry.

Figure 3:
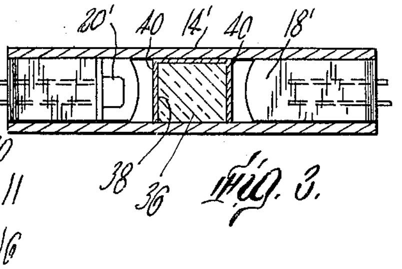
FIG. 3 is a sectional view of a modified form of control component constructed in accordance with principles of the invention suitable for use in the control circuit of a photomodulator.

A modified component structure is shown in FIG. 3 in which light source 18' and sensor 20' are secured in a similar tube 14'. Interposed between the light source 18' and sensor 20' is a light transmitting plug 36 of an acrylic resin (Lucite) or similar suitable material, one or both faces 38 of which is coated with an electrically conductive light transmitting layer 40 of Inconel and silicon monoxide. The layer or layers 40 are electrically connected to the wall of the metal tube 14 in a manner similar to that employed in the structure shown in FIGS. 1 and 2.

The light source 18 used in the preferred embodiment is a high intensity neon bulb, for example type NE2P, which does not include radioactive material to aid the starting characteristics. While other high intensity neon bulbs are suitable in many applications, it is preferred to employ one without auxiliary starting material so that a possible source of additional noise is avoided. The optically coupled cadmium selenide cell 20 is a high resistance element of a value in the order of fifty megohms at two foot candles light intensity at the photoconductor surface. The high intensity light source 18 produces a light level at the photoconductive surface in excess of one hundred foot candles sufficient to switch the high impedance light sensor element 20 through a resistance ratio of three orders of magnitude in a switching time of 20 microseconds, and from 10,000 megohms to 0.1 megohm in 200 microseconds, much faster than the switching time of photomodulators and similar types of control components commercially available.

Figure 4:
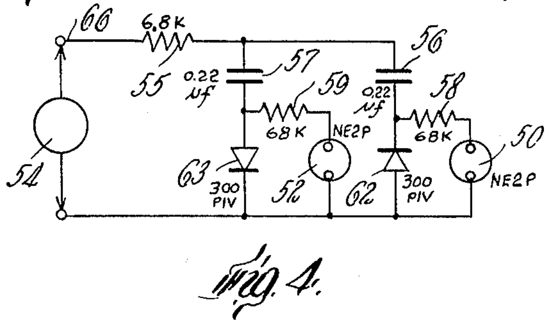
FIG. 4 is a schematic diagram of a light source energizing circuit for use with the photomodulator structure of FIG. 1.

In order to insure reliable starting (initiation of avalanche breakdown) of the neon bulb 18, the circuitry shown in FIG. 4 is employed. In this circuit the two lamps 50, 52 (corresponding to lamps 18) are connected in parallel across an energizing source 54 which produces a sinusoidal signal voltage as shown in FIG. *5a*. A series resistor 55 is connected in series with the source 54 and the two parallel energizing circuits each include a capacitor 56, 57, a resistance 58, 59 in series with the lamp and a diode 62, 63 which is connected across the lamp. The diodes 62, 63 are connected so that their polarities are reversed. Thus, on each half cycle one diode is reverse biased and forces any current flow through the lamp and in the other half cycle that diode presents a low impedance so that the current flow in that branch bypasses the lamp.

Figure 5:
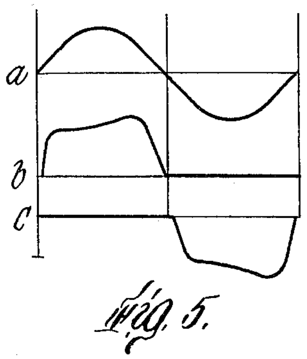
FIG. 5 is a diagram indicating waveforms produced across the light sources in the circuitry of FIG. 4 as a function of the signal applied at the input terminals.

With the values as indicated on the diagram for these components, the currents through the two lamp circuits are as shown in the waveforms of FIGS. *5b* and *5c*, the waveform of FIG. *5b* being the current through lamp 50 and the waveform of FIG. *5c* being the current through lamp 52. Thus when the upper terminal 66 is positive in the first half cycle as shown in FIG. 5, diode 63 is in its forward conducting direction and shunts lamp 52 so that no current will flow through that lamp. During this cycle, however, capacitor 57 is being charged with the polarity as indicated towards the crest voltage of the applied signal (which approaches a crest voltage of 160 volts at an applied signal value of 115 volts R.M.S.). This charge on the capacitor 56 remains stored as the input signal passes through voltage zero, and diode 63 becomes backbiased. The voltage across lamp 52 increases in the second half cycle, and the sum of the applied signal voltage and the stored charge exceeds the lamp's breakdown voltage and the current flow generally as shown in FIG. 5 results, which is indicative of the conduction angles of the two control devices. This applied voltage approaches twice the crest value of the applied signal and thus this input circuit enables high intensity bulbs to be reliably used even in applications where the applied R.M.S. voltage may fall to 90 volts. By adjustment of the values of the resistances and capacitances a substantially square wave current may be provided with lamp conduction in each half cycle in excess of 95%.

With the indicated components value, the modulator has a voltage conversion efficiency of 99% with a 1000 cycle per second control signal, substantially higher than the conversion efficiencies $$\left(\frac{Eo(pk-pk)}{E_{\text{in}}}\times 100\right)$$

obtainable with other commercially available devices operating at 60 cycle frequencies. A lamp energizing circuit employing a common capacitive storage element may be used to augment the peak value of the applied signal in a manner similar to the circuitry of FIG. 4, where the starting and cycle requirements are not as severe.

Figure 6:
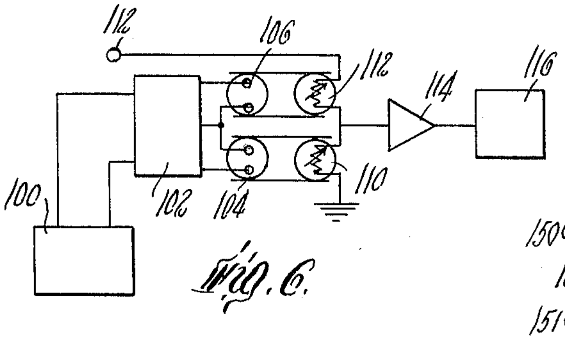
FIG. 6 is a schematic diagram of a photomodulator circuit incorporating control devices constructed in accordance with the invention.

FIG. 6 shows a pair of transducer elements employed in a modulator circuit energized from a one thousand cycle per second oscillator 100 applied through a voltage augmenting network 102 to alternately fire the neon bulbs 104, 106. These neon bulbs are electrically shielded from but closely coupled optically to the photocells 110, 112. The D.C. input voltage applied at terminal 112 to be amplified thus is chopped at the frequency of the oscillator 100 and the chopped signal is applied to amplifier circuitry 114 and demodulator circuitry 116 in conventional manner. A modulator constructed in this manner has the following specifications:

Offset voltage: 10 microvolts or less
Ofsett current: $10^{-13}$ ampere
Noise: $10^{-13}$ a. R.M.S./$\sqrt{f}$
Life: 25,000 hrs.
Phase angle: less than 5° lag at 60 c.p.s.

Figure 7:
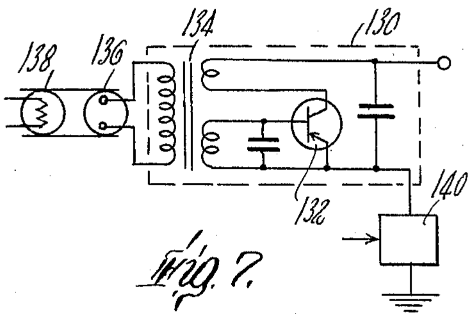
FIG. 7 is a proportional control arrangement employing a control device constructed in accordance with the invention.

The light source photocell transducer may be used as a proportionate controller, for example in the arrangement shown in FIG. 7. A conventional radio frequency oscillator 130 operating at a frequency of 300 kilocycles for example and including a transistor 132 and transformer 134 drives the neon bulb 136 which is coupled to a photocell 138 in the above described shielded transducer arrangement. By controlling the input voltage to the oscillator via control element 140 the radio frequency output current applied to neon lamp 136 maintains a stable glow discharge in the neon tube over a wider range of current variation than is possible with a direct current. The light output of the neon tube varies as a direct function of the current flow through the tube 136 and the variation in radiation intensity is efciently coupled to the cell 138 such that its electrical resistance varies directly as a function of the adjustment of control 140. In this control arrangement, an interdigitated type of photocell having resistance characteristics about one-twentieth those of the rectangular type of cell employed in the modulator used for pH measurements is presently employed. Thus the transducer in this arrangement provides accurate, continuously adjustable control over an extended range of values.

Figure 8:
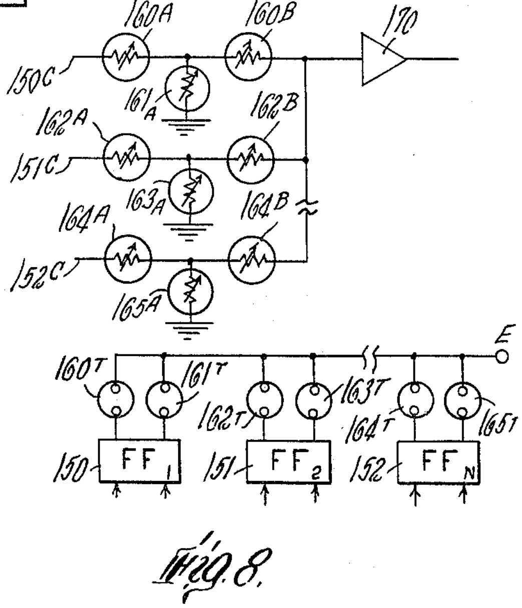
FIG. 8 is a schematic and logical block diagram of the channel switching arrangement employing control devices constructed in accordance with the invention.

A switching control circuit is shown in FIG. 8 in which rapid switching between channels of an input device may be accomplished in response to digital input control. In this circuitry there are provided three control flip-flops 150, 151, 152. The output terminal of each flip-flop has a neon tube component of a single cell or two cell control device 160–165 connected in series therewith so that the neon tube will light when that terminal of the flip-flop is up. Coupled to each of the tubes 160T, 162T, 164T (which are on the ONE side of the flip-flops) are two high resistance photocells 160A, 160B; 162A, 162B; 164A, 164B respectively. The ZERO side of each flip-flop has a neon tube 161T, 163T, 165T connected in series therewith and coupled to a single lower resistance photocell 161A, 163A, 165A respectively. The photocells are connected in a channel switching network so that each flip-flop controls a corresponding channel.

When flip-flop 150 is in the ONE state, for example, neon tube 160T of the unit 160 is energized and the resistances 160A, 160B are at their low values (100K ohms). Neon tube 161T is de-energized and resistance 161A is at its high value (500 megohms) so that a through impedance of channel 150C to the amplifier 170 or other output device has a low impedance and is isolated from ground. At the same time flip-flops 151 and 152 are in the ZERO states so that tubes 162 and 164 are de-energized and 163 and 165 are lighted. In this arrangement the resistances 163 and 165A in channels 151C and 152C are at low values while resistances 162A, 162B, 164A and 164B are at high values and prevent information transfer thereof without interference at the active channel. Switching between channels is in the order of 200 microseconds.

Other applications of the transducer and arrangements of the transducer components will occur to those skilled in the art. Therefore while preferred embodiments of the invention have been shown and described, it is not intended that the invention be limited to the disclosed embodiments or to details thereof and departures may be made therefrom within the spirit and scope of the invention as defined in the claims.

I claim:

1. A photomodulator for use with a high gain D.C. amplifier comprising two similar control devices,
each device including an electrically conductive tube,
a photoconductive cell disposed within said tube,
said cell having a resistance under a light intensity of two foot candles in the order of fifty megohms,
a neon bulb having a light output in the order of one hundred foot candles disposed in optically coupled relation to said cell,
and an electrically conductive film of uniform light transmitting characteristics disposed between said cell and said bulb and electrically connected to said tube,
said bulbs being connected in parallel in an input circuit including means for applying an alternating voltage to said bulbs,
an asymmetrically conductive device connected in parallel with each bulb,
and a series resistance capacitance circuit connected in series with each bulb for augmenting the voltage applied to each bulb and controlling the conduction angle of the control device,
and said cells being connected in series with an output circuit for controlling the channeling of a D.C. signal to said amplifier.

2. A photomodulator as claimed in claim 1 wherein said electrically conductive film consists of a metal film with an overcoating of a transparent dielectric material.

3. A photomodulator for use with a high gain D.C. amplifier comprising
two similar control devices,
each device including an electrically conductive tube,
a photoconductive cell disposed within said tube,
a light source disposed in optically coupled relation to said cell,
and an electrically conductive film of uniform light transmitting characteristics disposed between said cell and said light source and electrically connected to said tube,
and means to alternately energize said light sources.

4. A photomodulator as claimed in claim 3 wherein said electrically conductive film consists of a metal film with an overcoating of a transparent dielectric material.

5. A photomodulator for use with a high gain D.C. amplifier comprising
two similar control devices,
each device including an electrically conductive tube,
a photoconductive cell disposed within said tube,
a light source disposed in optically coupled relation to said cell,
and an electrically conductive film of uniform light transmitting characteristics disposed between said cell and said light source and electrically connected to said tube,
said light source being connected in parallel in an input circuit including means for applying an alternating voltage to said light sources,
an asymmetrically conductive device connected in parallel with each light source,
and a series resistance capacitance circuit connected in series with each light source for augmenting the voltage applied to each light source and controlling the conduction angle of the control device.

6. A photomodulator as claimed in claim 5 wherein said electrically conductive film consists of a metal film with an overcoating of a transparent dielectric material.

7. A signal converter comprising two electrical transducers each including a radiation source and a radiation sensor having an electrical characteristic which varies as a function of impinging radiation disposed in optically coupled relation to its associated radiation source,
a control circuit connected to said transducers,
said control circuit including means for applying an alternating voltage to said radiation sources,
an asymmetrically conductive device connected in parallel with each radiation source and a series resistance-capacitance circuit connected in series with each radiation source for augmenting the voltage applied to each light source and controlling the conduction angle of each transducer device,
and circuit means connected to said transducers for applying a D.C. signal to said radiation sensors.

8. The converter as claimed in claim 7 wherein said radiation sources are connected in parallel and said series resistance-capacitance circuit includes two capacitors,
each capacitor being connected in series with the parallel combination of the associated radiation source and asymmetrically conductive device.

9. The converter as claimed in claim 7 wherein each said transducer includes an electrically conductive tube and said source and sensor are disposed in light-tight relation inside said tube,
and further including an electrically conductive film of uniform optical transmission characteristics disposed between said source and said sensor and electrically connected to said tube.

10. The converter as claimed in claim 9 wherein each source and each sensor is housed in a transparent bulb and said electrically conductive film is deposited directly on the surface of a bulb so that it is interposed between the two bulbs in each transducer.

11. The converter as claimed in claim 9 and further including a transparent insert disposed in said tube between said source and said sensor,
said insert having a flat surface disposed perpendicularly to the axis between said source and said sensor,
and wherein said electrically conductive film is deposited on said flat surface and electrically connected to said tube.

12. The converter as claimed in claim 7 wherein said radiation source is a high intensity gas-filled glow tube and
said radiation sensor is a photoconductive cell having a resistance in the order of at least fifty megohms when exposed to a light intensity of two foot candles.

13. The converter as claimed in claim 9 wherein said electrically conductive film consists of a metal film with an overcoating of a transparent dielectric material.

14. A signal coupling device comprising a tubular member,
a radiation source disposed within said tubular member,
a radiation sensor member having an electrical characteristic which varies as a function of impinging radiation disposed within said tubular member in optically coupled relation to said radiation source,
an electrically conductive film of uniform radiation transmitting characteristics disposed within said tubular member and electrically connected thereto between said source and said sensor,
first terminal means for applying a signal to energize said source and produce radiation and second terminal means for connecting said sensor in an output circuit.

15. The device as claimed in claim 14 wherein said radiation sensor is a photosensitive element having an electrical resistance characteristic which varies as a function of impinging radiation,
the resistance characteristic of said photosensitive element being in the order of fifty megohms when the light intensity impinging on the photosensitive surface has a magnitude of two foot candles.

16. The device as claimed in claim 14 wherein said radiation source is a gas-filled bulb which produces a light level at the photosensitive surface of said radiation sensor in excess of one hundred foot candles.

17. The device as claimed in claim 14 and further including a network connected to said first set of terminals including unidirectionally conductive means connected in shunt with said radiation source, and a series resistance capacitance network connected to said radiation source so that a voltage in excess of the peak voltage of an alternating supply voltage may be impressed on said radiation source.

18. The device as claimed in claim 14 wherein each source and each sensor is housed in a transparent bulb and said electrically conductive film is deposited directly on the surface of a bulb so that it is interposed between the two bulbs in each transducer.

19. The device as claimed in claim 14 and further including a transparent insert disposed in said tube between said source and said sensor, said insert having a flat surface disposed perpendicularly to the axis between said source and said sensor, and wherein said electrically conductive film is deposited on said flat surface and electrically connected to said tube.

20. A photomodulator for use with a high gain D.C. amplifier comprising two similar control devices, each device including an electrically conductive tube having a reflective inner surface, a photoconductive cell housed in a transparent bulb disposed within said tube, said cell having a resistance under a light intensity of two foot candles in the order of fifty megohms, a high intensity neon light source housed in a transparent bulb, said light source having a light output in the order of one hundred foot candles and disposed within said tube in optically coupled relation to said cell, and an electrically conductive film of uniform and high light transmitting characteristics deposited on a bulb surface and extending across the bulb surface within said tube so that it is disposed between said cell and said bulb, said film having a thickness in the order of one hundred Angstrom units and being electrically connected to said tube, said light sources being connected in parallel in an input circuit including means for applying an alternating voltage to said light sources, a diode connected in parallel with each light source, and a series resistance capacitance circuit including a capacitor connected in series with each light source-diode circuit for augmenting the voltage applied to each light source, and said cells being connected in series with an output conductor for controlling the channeling of a D.C. signal to an amplifier.

21. A photomodulator as claimed in claim 20 wherein said electrically conductive film has an overcoating of a transparent dielectric material.

22. A high speed control element for low level signal control of alternating and substantially direct current signals comprising an electrically conductive tube having a reflective inner surface, a photoconductive cell housed in a transparent bulb disposed within said tube, a gas discharge light source housed in a transparent bulb, and an electrically conductive film of uniform and high light transmitting characteristics deposited on a surface of said bulb.

23. A control element as claimed in claim 22 wherein said electrically conductive film shall consist of a metal film with an overcoating of a transparent dielectric material.

References Cited by the Examiner

UNITED STATES PATENTS

| | | | |
|---|---|---|---|
| 2,839,616 | 6/1958 | MacMillan | 330—10 |
| 2,904,695 | 9/1959 | White | 250—239 X |
| 3,102,227 | 8/1963 | De Gier | 250—209 X |
| 3,130,349 | 4/1964 | Mallory | 250—217 X |
| 3,143,655 | 8/1964 | Strandberg | 250—239 |
| 3,153,149 | 10/1964 | Finigian | 250—239 |

RALPH G. NILSON, *Primary Examiner.*

WALTER STOLWEIN, *Examiner.*

Disclaimer 3,283,157.—*David E. Blackmer*, Waltham, Mass. PHOTOMODULATOR FOR USE WITH HIGH GAIN D.C. AMPLIFIER. Patent dated Nov. 1, 1966. Disclaimer filed Aug. 23, 1968, by the assignee, *Leeds & Northrup Company.*

Hereby enters this disclaimer to claims 3, 4, 14, 15, 16, 18, 19, 22 and 23 of said patent.

[*Official Gazette January 7, 1969.*]